(12) United States Patent
O'Meara et al.

(10) Patent No.: US 8,664,102 B2
(45) Date of Patent: Mar. 4, 2014

(54) DUAL SIDEWALL SPACER FOR SEAM PROTECTION OF A PATTERNED STRUCTURE

(75) Inventors: David L. O'Meara, Poughkeepsie, NY (US); Anthony Dip, Cedar Creek, TX (US); Aelan Mosden, Poughkeepsie, NY (US); Pao-Hwa Chou, Kofu (JP); Richard A Conti, Katonah, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 580 days.

(21) Appl. No.: 12/751,891

(22) Filed: Mar. 31, 2010

(65) Prior Publication Data

US 2011/0241085 A1 Oct. 6, 2011

(51) Int. Cl.
*H01L 21/3205* (2006.01)
*H01L 21/4763* (2006.01)

(52) U.S. Cl.
USPC ............... 438/595; 438/696; 257/E21.626; 257/E21.64

(58) Field of Classification Search
USPC .................. 257/E21.626, E21.64
See application file for complete search history.

(56) References Cited

U.S. PATENT DOCUMENTS

| | | | |
|---|---|---|---|
| 6,194,310 B1 | 2/2001 | Hsu et al. | |
| 6,319,775 B1 | 11/2001 | Halliyal et al. | |
| 6,991,991 B2 | 1/2006 | Cheng et al. | |
| 7,202,187 B2 | 4/2007 | Ramachandran et al. | |
| 7,397,073 B2 | 7/2008 | Engel et al. | |
| 7,420,240 B2 | 9/2008 | Rudeck | |
| 2002/0068398 A1 | 6/2002 | Dong et al. | |
| 2006/0094192 A1 | 5/2006 | Yang et al. | |
| 2006/0286817 A1 | 12/2006 | Kato et al. | |
| 2007/0252221 A1* | 11/2007 | Ohta | 257/408 |
| 2008/0054356 A1 | 3/2008 | Yoshida | |
| 2011/0163357 A1 | 7/2011 | Tan et al. | |

OTHER PUBLICATIONS

U.S. Appl. No. 12/751,926 entitled "Multilayer Sidewall Spacer for Seam Protection of a Patterned Structure," First Named Inventor: David L. O'Meara, filed on Mar. 31, 2010.
United States Patent and Trademark Office, Non-final Office Action in related U.S. Appl. No. 12/751,926, mailed Sep. 14, 2012, 20 pages.
X.L. Xu et al, "Characterization of Thin Silicon Oxynitride Films Prepared by Low Pressure Rapid Thermal Chemical Vapor Deposition", Oct. 1993, J. Electrochem. Soc., vol. 140, No. 10, pp. 2970-2974.
United States Patent and Trademark Office, Final Office Action in related U.S. Appl. No. 12/751,926, mailed May 3, 2013, 11 pages.

* cited by examiner

*Primary Examiner* — Daniel Whalen (57) ABSTRACT

A semiconducting device with a dual sidewall spacer and method of forming are provided. The method includes: depositing a first spacer layer over a patterned structure, the first spacer layer having a seam propagating through a thickness of the first spacer layer near an interface region of a surface of the substrate and a sidewall of the patterned structure, etching the first spacer layer to form a residual spacer at the interface region, where the residual spacer coats less than the entirety of the sidewall of the patterned structure, depositing a second spacer layer on the residual spacer and on the sidewall of the patterned structure not coated by the residual spacer, the second spacer layer being seam-free on the seam of the residual spacer, and etching the second spacer layer to form a second spacer coating the residual spacer and coating the sidewall of the patterned structure not coated by the residual spacer.

13 Claims, 5 Drawing Sheets

DUAL SIDEWALL SPACER FOR SEAM PROTECTION OF A PATTERNED STRUCTURE

CROSS-REFERENCE TO RELATED APPLICATION

The present invention is related to U.S. patent application Ser. No. 12/751,926, entitled "MULTILAYER SIDEWALL SPACER FOR SEAM PROTECTION OF A PATTERNED STRUCTURE", filed on even date herewith. The entire content of this application is incorporated herein by reference.

FIELD OF INVENTION

The present invention relates to semiconductor structures and devices having enhanced resistance to shorting and contaminant transfer, and more particularly to metal oxide semiconductor field effect transistors (MOSFETS), in which electrical shorting and contaminant transfer between the gate stack and surrounding regions is substantially eliminated.

BACKGROUND OF THE INVENTION

Field effect transistors (FETs) are the basic building block of today's integrated circuits (ICs). Such transistors can be formed in conventional substrates (such as silicon) or in silicon-on-insulator (SOI) substrates. State of the art MOS transistors are fabricated by depositing a gate stack material over a gate dielectric and a substrate. Generally, the MOS transistor fabrication process implements lithography and etching processes to define the conductive, e.g., poly-Si, Si, gate structures. Source/drain extensions are formed by implantation, in which the implant is performed using a spacer to create a specific distance between the gate and the implanted junction. In some instances, such as in the manufacture of an NFET device, the source/drain extensions for the NFET device are implanted with no spacer. For a PFET device, the source/drain extensions are typically implanted with a spacer present. A thicker spacer is typically formed after the source/drain extensions have been implanted. Deep source/drain implants are then performed with the thick spacer present. High temperature anneals are performed to activate the junctions after which the source and drain regions and the top portion of the gate are silicided. Silicide formation typically requires that a refractory metal be deposited on the silicon wafer followed by a high temperature thermal anneal process to produce the silicide material. The structure is then passivated by a blanket-deposited conformal dielectric material.

In order to be able to make ICs, such as memory, logic, and other devices, of higher integration density than currently feasible, one has to find a way to further downscale the dimensions of field effect transistors (FETs), such as metal oxide semiconductors. The downscaling of transistor dimensions allows for improved performance as well as compactness, but such downscaling has some device degrading effects.

Further scaling of semiconducting devices requires that the electrical leakage and contamination transfer pathways through seams present in a conventional spacer be interrupted to ensure that the electrical pathways and contaminant transfer pathways between the gate conductor and the contacts to the source and drain region of the device are severed.

SUMMARY OF THE INVENTION

Embodiments of the invention provide a semiconducting patterned structure and method of forming. The patterned structure contains a dual sidewall spacer structure in which a discontinuous electrical pathway and a discontinuous contaminant transfer pathway through the dual sidewall spacer structure are provided.

According to one embodiment of the invention, the method includes providing a substrate containing a patterned structure on a surface of the substrate, depositing a first spacer layer over the patterned structure, the first spacer layer having a seam propagating through a thickness of the first spacer layer near an interface region of the surface of the substrate and a sidewall of the patterned structure, and etching the first spacer layer to form a residual spacer at the interface region, where the residual spacer coats less than the entirety of the sidewall of the patterned structure. The method further includes depositing a second spacer layer on the residual spacer and on the sidewall of the patterned structure not coated by the residual spacer, the second spacer layer being seam-free on the seam of the residual spacer, and etching the second spacer layer to form a second spacer coating the residual spacer and coating the sidewall of the patterned structure not coated by the residual spacer.

According to another embodiment of the invention, a method is provided for forming a dual sidewall spacer for seam protection of gate stack. The method includes providing a substrate with a gate stack containing a gate dielectric on the substrate, a source region and a drain region in the surface of the substrate adjacent the gate dielectric, and a gate conductor on the gate dielectric, depositing a first spacer layer over the gate stack, the first spacer layer having a seam propagating through a thickness of the first spacer layer near an interface region of the surface of the substrate and a sidewall of the gate stack, and etching the first spacer layer to form a residual spacer at the interface region, where the residual spacer coats less than the entirety of the sidewall of the gate stack. The method further includes depositing a second spacer layer on the residual spacer and on the sidewall of the gate stack not coated by the residual spacer, the second spacer layer being seam-free on the seam of the residual spacer, and etching the second spacer layer to form a second spacer coating the residual spacer and coating the sidewall of the gate stack not coated by the residual spacer.

According to yet another embodiment, a semiconducting device is provided. The device includes a substrate containing a patterned structure on the substrate surface, a residual spacer on an interface region formed by the substrate surface and a sidewall of the patterned structure, the residual spacer coating less than the entire sidewall of the patterned structure and having a seam propagating through a thickness of the residual spacer in the interface region, and a second spacer coating the residual spacer and coating the sidewall of the patterned structure not coated by the residual spacer, the second spacer layer being seam-free on the seam of the residual spacer.

DETAILED DESCRIPTION OF SEVERAL EMBODIMENTS OF THE INVENTION

Embodiments of the invention provide a semiconducting patterned structure and method of forming. The semiconducting structure has a dual spacer structure for seam protection of the semiconducting structure, for example a gate stack of a field effect transistor. In general, the dual spacer structure may be used for various 3D structures used in electronic devices. It is noted that the drawings of the present application are provided for illustrative purposes and thus they are not drawn to scale. In particular, the dimensions of the seams and their relative position to each other have been enlarged to exemplify embodiments of the present invention.

In the accompanying drawings, like and/or corresponding elements are referred to by like reference numbers. In the drawings, an exemplary single gate stack (region) is shown and described. Despite this illustration, embodiments of the present invention are not limited to a structure including a single gate stack. Instead, a plurality of such gate stacks is contemplated.

Figure 1A:
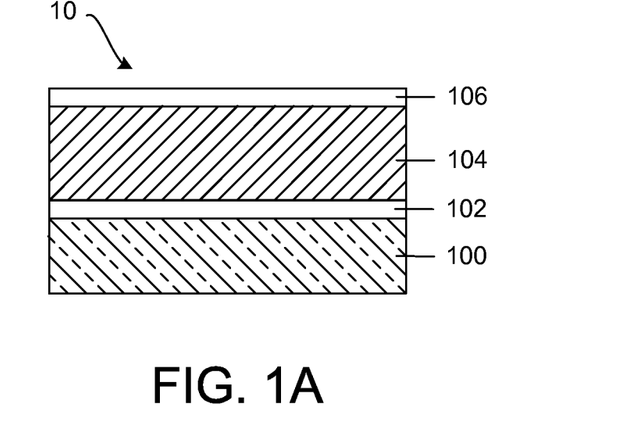
FIGS. 1A-1J are pictorial representations (through cross-sectional views) showing basic processing steps that may be employed to produce a semiconducting patterned structure according to an embodiment of the invention.

FIGS. 1A-1J are pictorial representations (through cross-sectional views) showing basic processing steps that may be employed to produce a semiconducting patterned structure according to an embodiment of the invention. FIG. 1A shows a film structure 10 containing gate stack layers 102, 104, 106 provided atop a substrate 100. Forming of the film structure 10 can include depositing a gate dielectric layer 102 on the substrate 100, depositing a gate conductor layer 104 on the gate dielectric layer 102, and depositing a gate cap layer 106 on the gate conductor layer 104. In another example, the gate cap layer 106 may be omitted. One or more of these layers may be formed on the substrate 100 using deposition methods such as chemical vapor deposition (CVD), atomic layer deposition (ALD), or variants thereof.

The substrate 100 includes, but is not limited to: any semiconducting material such as Si-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures.

When the substrate 100 is a silicon-on-insulator (SOI) or SiGe-on-insulator (SGOI) substrate, the thickness of the Si-containing layer atop the buried insulating layer typically can have a thickness on the order of 10 nm or greater. The SOI or SGOI substrate may be fabricated using techniques that are well known to those skilled in the art. For example, the SOI or SGOI substrate may be fabricated using a thermal bonding process, or alternatively by an ion implantation process, which is referred to in the art as separation by ion implantation of oxygen (SIMOX).

Still referring to FIG. 1A, the gate dielectric layer 102, formed atop the substrate 100, is typically an oxide or oxygen-based material. The gate dielectric layer 102 may also be composed of a nitride, an oxynitride, or a combination thereof. The gate dielectric layer 102 may be formed using a deposition technique such as CVD, ALD, atomic layer CVD (ALCVD), pulsed CVD, plasma assisted CVD (PACVD), sputtering, and chemical solution deposition, or alternatively, the gate dielectric layer 102 may formed by a thermal growing process, which may include oxidation, oxynitridation, nitridation, and/or plasma or radical treatment. Suitable examples of oxides that can be employed as the gate dielectric layer 102 include, but are not limited to: $SiO_2$, $Al_2O_3$, $ZrO_2$, $HfO_2$, $Ta_2O_3$, $TiO_2$, perovskite-type oxides and combinations and multi-layers thereof. In some examples, the material of the gate dielectric layer 102 may be doped with metals to achieve the desired workfunction.

The gate conductor layer 104 is comprised of a conductive material such as polysilicon or an appropriate metal or metal compound. The gate conductor layer 104 may be formed atop the gate dielectric layer 102 utilizing a deposition process such as CVD, ALD, ALCVD, pulsed CVD, PACVD, or sputtering. According to one embodiment, the gate conductor layer 104 may comprise doped polysilicon. The polysilicon dopant can be an element from Group III-A or an element from Group V-A of the Periodic Table of Elements. The dopant may be introduced during deposition of the gate conductor layer 104, after deposition, or following subsequent patterning and etching of the gate conductor layer 104. Alternately, the gate conductor layer 104 may comprise a metal (for example, W, Ir, Re, Ru, Ti, Ta, Hf, Mo, Nb, Ni, or Al), a metal silicide, a metal nitride, a metal oxide, or other conductive material.

Still referring to FIG. 1A, the gate cap layer 106 may comprise a dielectric that can be deposited by CVD and related methods. Typically, the composition of gate cap layer 106 may include silicon oxides, silicon carbides, silicon nitrides, silicon carbonitrides, etc. Spin-on dielectrics may also be utilized as the gate cap layer 106 including, but not limited to: silsesquioxanes, siloxanes, and boron phosphate silicate glass (BPSG). The gate cap layer 106 may be patterned using photolithography and etching. Specifically, a pattern is produced by applying a photoresist to the surface to be patterned, exposing the photoresist to a pattern of radiation, and then developing the pattern into the photoresist utilizing a conventional resist developer.

Figure 1B:
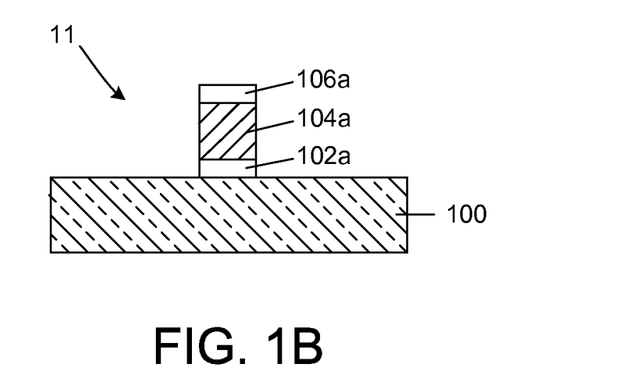

Once the patterning of the photoresist is completed, the sections covered by the photoresist are protected, while the exposed regions are removed using a selective etching process that removes the unprotected regions of the gate cap layer 106 forming a gate cap 106a. Following the formation of the gate cap 106a, the film structure 10 is then etched by a directional etch process, such as reactive ion etching, having high selectivity for removing the material of the gate conductor layer 104 to form the gate conductor 104a and removing the material of the gate dielectric layer 102 to form the gate dielectric 102a without substantially etching the patterned gate cap 106a and the substrate 100. The resulting structure 11 is shown in FIG. 1B.

Figure 1C:
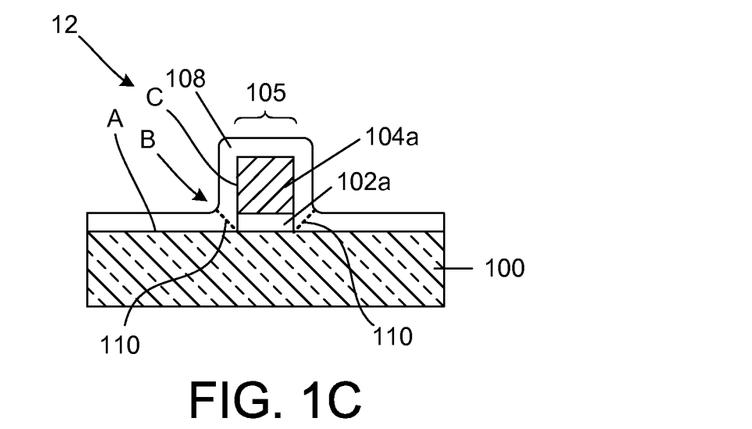

The gate cap 106a may then be removed using a chemical strip or etch process. FIG. 1C shows a structure 12 that contains a gate stack 105. The gate stack 105 includes the gate dielectric 102a and the gate conductor 104a positioned atop the gate dielectric 102a. According to an embodiment of the invention, a thin first spacer layer 108 is conformally deposited over the gate stack 105 and on the substrate 100 around the gate stack 105. A thickness of the deposited first spacer layer 108 may range from about 1 nm to about 20 nm, or from about 2 nm and 10 nm, for example about 3 nm.

The material of the first spacer layer 108 may be selected from nitrides, oxides, oxynitrides, and combinations thereof. Examples include nitrides, oxides, and oxynitrides of silicon. The first spacer layer 108 may be deposited by deposition process such as CVD, ALD, ALCVD, pulsed CVD, or PACVD. In one example, silicon nitride may be deposited by CVD using simultaneous exposures of dichlorosilane (DCS) and ammonia ($NH_3$) at a substrate temperature suited for CVD.

In another example, silicon nitride may be deposited by ALD using alternating exposures of DCS and $NH_3$ at a lower substrate temperature suited ALD. Other silicon-containing gases may be used for depositing the silicon nitride, for example other chlorosilanes, e.g., tetrachlorosilane ($SiCl_4$), trichlorosilane ($SiHCl_3$), chlorosilane ($SiH_3Cl$), and chlorodisilanes, e.g., hexachlorodisilane ($Si_2Cl_6$). Low gas pressure processing may be utilized, where process gas pressures are between about 1 mTorr and about 50 mTorr, or between about 50 mTorr and about 1 Torr. Alternately, process gas pressures may be higher than 1 Torr, for example higher than 10 Torr.

The structure 12 contains a seam 110 in the conformal first spacer layer 108, where the seam 110 is formed in an interface region B where two perpendicular surfaces A (vertical sidewall of gate stack 105) and C (horizontal surface of the substrate 100) meet. As depicted in FIG. 1C, the seam 110 propagates at an approximately 45 degree angle from the two perpendicular surfaces A and C. Such as seam 110 has been observed by transmission electron microscopy (TEM). It is contemplated that the seam 110 is formed due to interrupted film growth where the abrupt change in topography of the structure 12 occurs in the interface region B. The change in topography between surfaces A and C depicted in the interface region B in FIG. C is with an angle of approximately 90 degrees.

In another example, shown and described in FIGS. 2A-2E, a change in topography with an angle that is less than 90 degrees can be due to an undercut in the gate dielectric 102a. Such an undercut can further enhance the formation of the seam 110.

Figure 1D:
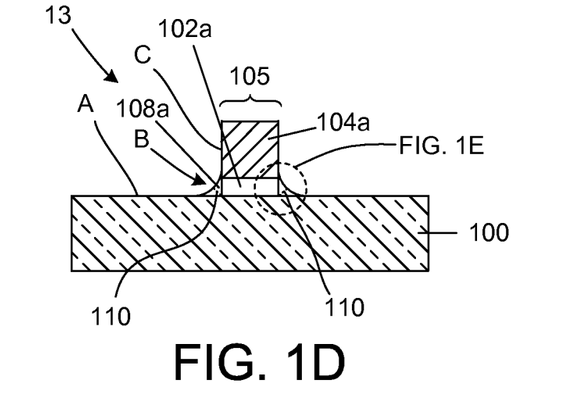

Still referring to FIG. 1C, the inventors have realized that the presence of the seam 110 in the first spacer layer 108 can be highly problematic to the integrity of the gate stack 105 and regions surrounding the gate stack 105. For example, the seam 110 breaches the seal of the gate stack 105 provided by the first spacer layer 108 and is a potential source of electrical leakage and contaminant transfer (e.g., oxygen diffusion) from the surrounding regions. Such contaminant transfer can affect the material and electrical properties of the gate stack 105. For example, a dielectric constant of the gate dielectric 102a and workfunction of the gate conductor 104a may be adversely affected by oxygen diffusion from the surrounding areas to the gate stack 105. Embodiments of the invention provide a method for breaking up a continuity of the seam 110 to reduce or prevent continuity of a path for contaminant transfer and reduce or prevent an electrical pathway through the seam 110. According to an embodiment of the invention, the first spacer layer 108 may be dry etched using an anisotropic plasma etching process, for example a reactive ion etching (RIE) process. The resulting residual spacer 108a shown in the structure 13 depicted in FIG. 1D is further shown in the exploded view in FIG. 1E. According to one embodiment of the invention, the residual spacer 108a covers a sidewall of the gate stack 105 in region B where the two perpendicular surfaces A and C meet, but the residual spacer 108a does not cover the entire surface C, including the upper region of the surface C that includes the sidewall of the gate conductor 104a. Other dry etching processes for plasma etching the first spacer layer 108 to form the residual spacer 108a are well known to those in the art.

Figure 1E:
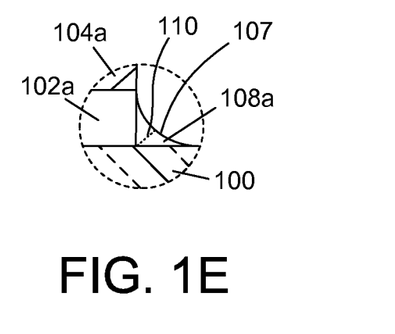

As depicted in FIG. 1D and further in the exploded view in FIG. 1E, formation of the residual spacer 108a changes the approximately 90 degree angle of the conformal first spacer layer 108 in the region B to film angle 107 that is greater than 90 degrees. In other words, the residual spacer 108a has film angle 107 on the concave film surface in the region B that is greater than 90 degrees, for example a film angle 107 of approximately 180 degrees depicted in FIG. 1E. Thus, formation of the residual spacer 108a in the region B provides a new deposition surface for deposition of a seamless spacer layer on the residual spacer 108a, thereby breaking up continuity of the seam 110.

Figure 1F:
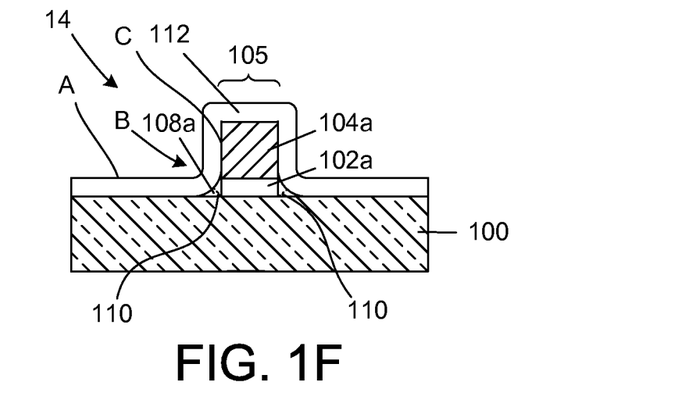

FIG. 1F depicts a structure 14 containing a second spacer layer 112 conformally deposited over the gate stack 105. A thickness of the deposited second spacer layer 112 may range from about 1 nm to about 20 nm, or from about 2 nm and 10 nm, for example about 3 nm.

According to some embodiments of the invention, the second spacer layer 112 may be selected from nitrides, oxides, oxynitrides, and combinations thereof. Examples include nitrides, oxides, and oxynitrides of silicon. The second spacer layer 112 may be deposited by deposition process such as CVD, ALD, ALCVD, pulsed CVD, or PACVD. According to one embodiment, ALD silicon nitride may be used to deposit a highly conformal second spacer layer 112.

In one example, the first and second spacer layers 108, 112 may contain the same or similar material (e.g., nitrides, oxides, and oxynitrides of silicon). In another example, the first and second conformal spacer layers 108, 110 may contain a different material selected from the group containing or consisting of nitrides, oxides, and oxynitrides of silicon. For example, the first spacer layer 108 may contain or consist of silicon nitride ($Si_xN_y$, e.g., $Si_3N_5$, SiN, etc.) and the second spacer layer 112 may contain or consist of silicon oxide ($SiO_z$, where z is greater than zero (e.g., $SiO_2$, SiO, etc.). In another example, the first spacer layer 108 may contain or consist of silicon oxide and the second spacer layer 112 may contain or consist of silicon nitride. Alternately or in addition to the above materials, in other examples, the first spacer layer 108, the second spacer layer 112, or both, may contain SiCN, SiBN, or SiBCN, or a combination thereof. A thickness of each of the deposited first and second spacer layers 108, 110 may range from about 1 nm to about 20 nm, from about 2 nm and about 10 nm, for example about 3 nm.

The second spacer layer 112 is void of any seam on the residual spacer 108a and the combination of the residual spacer 108a and the second spacer layer 112 provide a dual sidewall spacer for seam protection, in which the discontinuation of the seam 110 by the second spacer layer 112 ensures that the gate conductor 104a is electrically isolated and contamination transfer to the gate stack 105 is prevented.

Figure 1G:
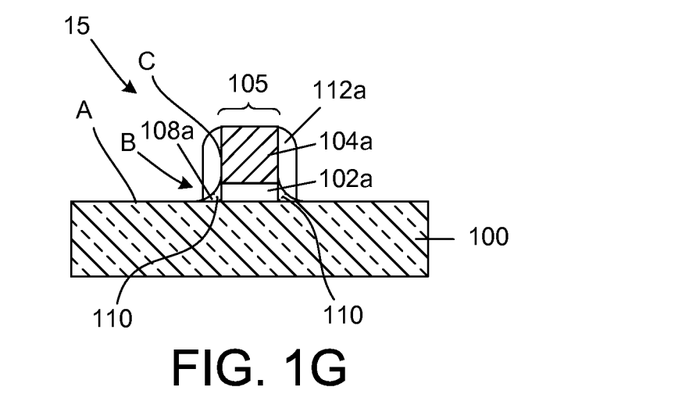

FIG. 1G depicts a structure 15 containing a second spacer 112a on the vertical sidewall of the gate stack 105. The second spacer layer 112 may be dry etched using an anisotropic plasma etching process, for example a reactive ion etching (RIE) process. The resulting second spacer 112a is a sidewall spacer and covers a sidewall of the gate stack 105 and the residual spacer 108a. Dry etching processes for plasma etching the second spacer layer 112 to form the second spacer 112a are well known to those in the art. In one example, similar plasma etching processes may be used for etching the first and second spacer layers 108, 112; where the first spacer layer 108 is plasma etched for a longer period of time than the second spacer layer 112.

Figure 1H:
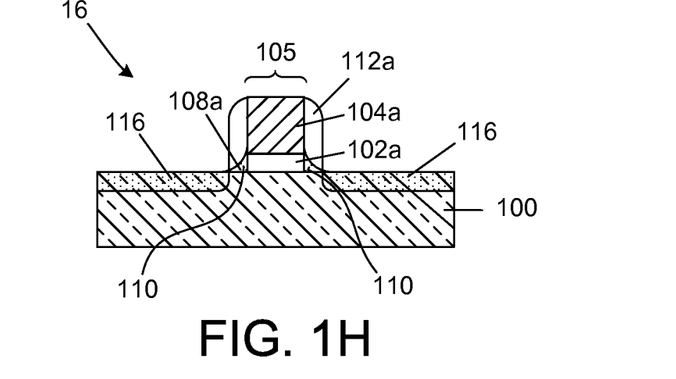

FIG. 1H depicts a structure 16 containing source and drain extension regions 116 formed in substrate 100. The source and drain extension regions 116 are formed via ion implantation and can comprise a combination of normally incident and optionally angled implants to form the desired grading in the dopant regions that may partially extend under the gate stack 105. PFET devices are produced within Si-containing substrates by doping the source and drain extension regions 116 with elements from Group V of the Periodic Table of Elements. NFET devices are produced within Si-containing substrates by doping the source and drain extension regions 116 with elements from Group III-A of the Periodic Table of Elements. Halo regions can also be formed beneath the source and drain extension regions 116 using an angled ion implantation and a dopant having a conductivity type opposite the source and drain extension regions 116.

Following formation of the source and drain extension regions 116, the source and drain extension regions 116 and the gate stack 105 are activated by activation annealing using a conventional process such as, but not limited to: rapid thermal annealing, furnace annealing, flash lamp annealing or laser annealing. Activation anneal may, for example, be conducted at a temperature ranging from about 850° C. to about 1350° C.

Figure 1I:
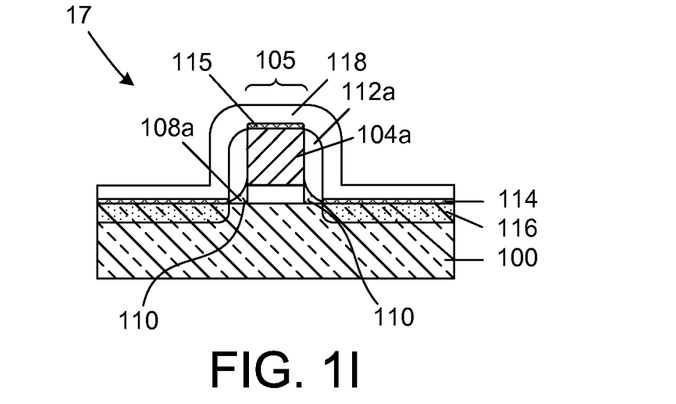

FIG. 1I depicts silicide regions 114,115 formed atop the source and drain extension regions 116 and the gate stack 105. Silicide formation typically requires depositing a metal layer onto the surface of a Si-containing material or wafer. The metal layer may be formed using a conventional process including, but not limited to: CVD, plasma-assisted CVD, high-density chemical vapor deposition (HDCVD), plating, sputtering, evaporation and chemical solution deposition. Metals deposited for silicide formation include Ta, Ti, W, Pt, Co, Ni, and combinations thereof, most preferably being Co or Ni. Following deposition, the structure is subjected to an annealing step using a conventional process such as, but not limited to: rapid thermal annealing. During annealing, the deposited metal reacts with Si forming a metal silicide.

Following silicidation, a conformal dielectric passivation film 118 is formed atop the gate stack 105 and the substrate 100. The conformal dielectric passivation film 118 may be selected from nitrides, oxides, oxynitrides, and combinations thereof. Examples include nitrides, oxides, and oxynitrides of silicon. The conformal dielectric passivation film 118 may be deposited by deposition process such as CVD, ALD, ALCVD, pulsed CVD, or PACVD. According to one embodiment, ALD SiN may be used to deposit the conformal dielectric passivation film 118.

Figure 1J:
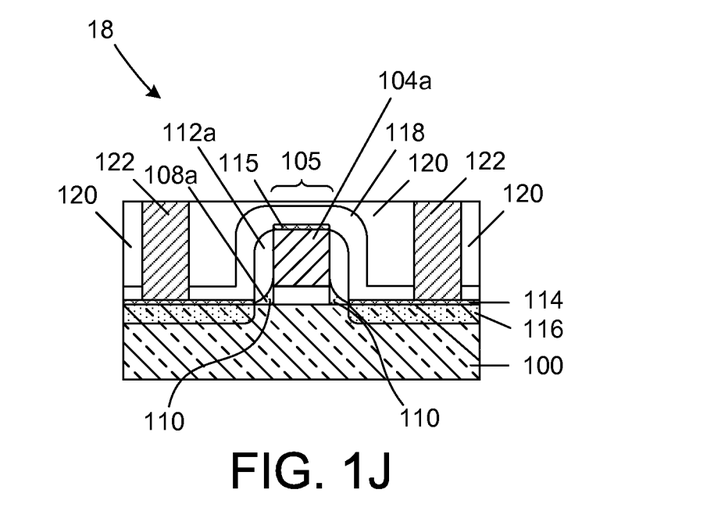

Following the formation of the conformal dielectric passivation film 118, the structure 17 depicted in FIG. 1I is further processed. The resulting structure 18 is depicted in FIG. 1J. The processing includes blanket depositing an interlayer dielectric 120 atop the structure 17 and performing a planarization process. The interlayer dielectric 120 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable.

The interlayer dielectric 120 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The interlayer dielectric 120 is then patterned and etched using conventional photolithography and etching to form vias to expose a portion of the conformal dielectric passivation film 118 overlying the silicide region 114. The silicide region is then exposed by an etch chemistry that removes the exposed portions of the conformal dielectric passivation film 118, without etching the interlayer dielectric 120 or the silicide region 114. Metal contacts 122 to the silicide region 114 are then formed by depositing a conductive metal into the via holes using conventional processing, such as sputtering or plating. The conductive metal may include, but is not limited to: tungsten, copper, aluminum, silver, gold, and alloys thereof.

Figure 2A:
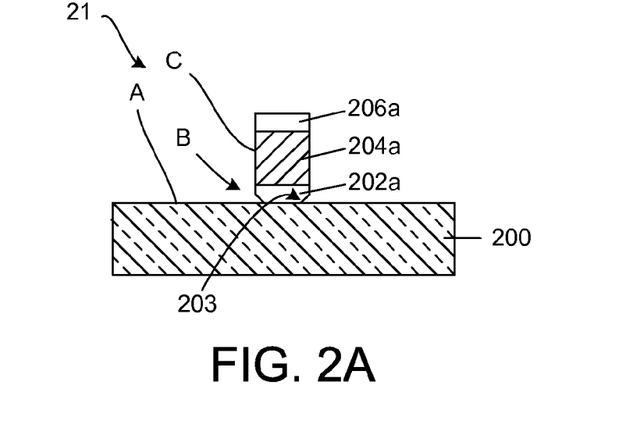
FIGS. 2A-2G are pictorial representations (through cross-sectional views) showing basic processing steps that may be employed to produce a semiconducting structure according to another embodiment of the invention.

FIGS. 2A-2G are pictorial representations (through cross-sectional views) showing basic processing steps that may be employed to produce a semiconducting structure according to another embodiment of the invention. The structure 21 in FIG. 2A is similar to the structure 11 in FIG. 1B and can contain the same or similar materials and layers as the structure 11. The structure 21 contains a gate cap 206a, a gate conductor 204a, and a gate dielectric 202a on substrate 200. The gate dielectric 202a depicted in FIG. 2A has an undercut 203 in the gate dielectric 202a in region B where surfaces A and C meet. The undercut 203 may be formed during a directional etch process, such as reactive ion etching, when forming the structure 21.

Figure 2B:
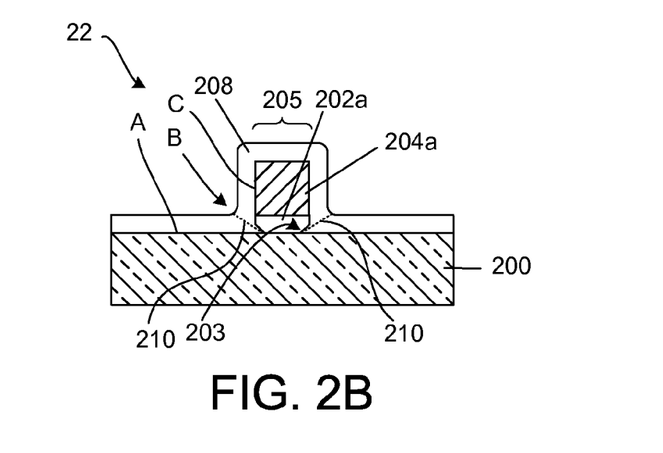

FIG. 2B schematically shows a structure 22 containing a seam 210 in a first spacer layer 208 deposited on gate stack 205. The seam 210 in the first spacer layer 208 can originate inside or near the undercut 203. As depicted in FIG. 2B, the seam 210 can propagate at an approximately 45 degree angle from inside the undercut 203 through a thickness of the first spacer layer 208. Embodiments of the invention provide a method for breaking up a continuity of the seam 210 to reduce or prevent continuity of a path for contaminant transfer and to prevent an electrical pathway through the seam 210. The first spacer layer 208 may be selected from nitrides, oxides, oxynitrides, and combinations thereof. Examples include nitrides, oxides, and oxynitrides of silicon. The first spacer layer 208 may be deposited by deposition process such as CVD, ALD, ALCVD, pulsed CVD, or PACVD. According to one embodiment, ALD silicon nitride may be used to deposit a highly conformal first spacer layer 208.

Figure 2C:
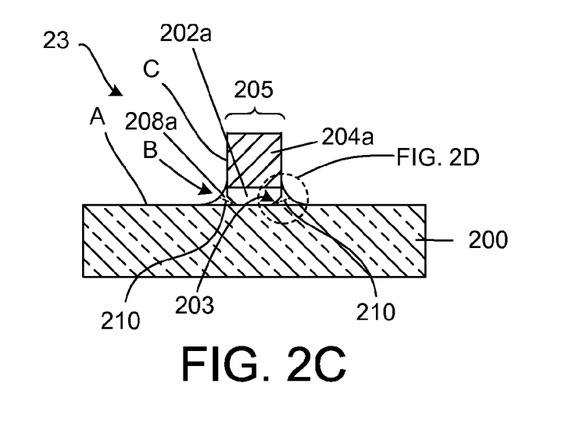
Figure 2D:
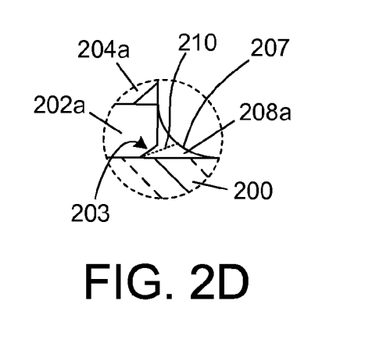

According to an embodiment of the invention, the first spacer layer 208 may be dry etched using an anisotropic plasma etching process, for example a reactive ion etching (RIE) process. The resulting residual spacer 208a shown in the structure 23 depicted in FIG. 2C is further shown in the exploded view in FIG. 2D. According to one embodiment of the invention, the residual spacer 208a covers a sidewall of the gate stack 205 in region B where the two perpendicular surfaces A and C meet, but the residual spacer 208a does not cover the entire surface C, including the upper region of the surface C that includes the sidewall of the gate conductor 204a. Dry etching processes for plasma etching the first spacer layer 208 to form the residual spacer 208a are well known to those in the art.

As depicted in FIG. 2C and further in the exploded view in FIG. 1D, formation of the residual spacer 108a changes the approximately 90 degree angle of the conformal first spacer layer 108 in the region B to film angle 207 that is greater than 90 degrees. In other words, the residual spacer 208a has a film angle 207 on the concave film surface in the region B that is greater than 90 degrees, for example a film angle 207 of approximately 180 degrees depicted in FIG. 2D. Thus, formation of the residual spacer 208a in the region B provides a new deposition surface for deposition of a seamless spacer layer on the residual spacer 208a, thereby breaking up continuity of the seam 210.

Figure 2E:
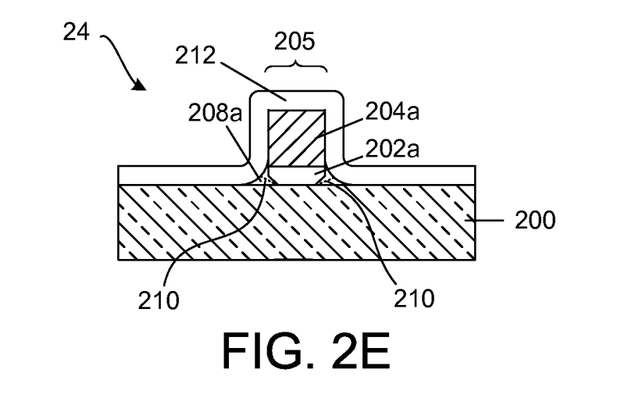

FIG. 2E depicts a structure 24 containing a conformal second spacer layer 212 deposited over the gate stack 205. Since formation of a seam in the second spacer layer 212 is avoided, the combination of the residual spacer 208a and the second spacer layer 212 provide a dual sidewall spacer for seam protection, in which the discontinuation of the seam 210 by the second spacer layer 212 ensures that the gate conductor 204a is electrically isolated and contamination transfer to the gate stack 205 is prevented. A thickness of the deposited second spacer layer 212 may range from about 1 nm to about 20 nm, or from about 2 nm and 10 nm, for example about 3 nm.

According to some embodiments of the invention, the second spacer layer 212 may be selected from nitrides, oxides, oxynitrides, and combinations thereof. Examples include nitrides, oxides, and oxynitrides of silicon. The second spacer layer 212 may be deposited by deposition process such as CVD, ALD, ALCVD, pulsed CVD, or PACVD. According to one embodiment, ALD silicon nitride may be used to deposit a highly conformal second spacer layer 212. A thickness of the deposited second spacer layer 112 may range from about 1 nm to about 20 nm, from about 2 nm and 10 nm, for example about 3 nm.

In one example, the first and second conformal spacer layers 208, 212 may contain the same or similar material (e.g., nitrides, oxides, and oxynitrides of silicon). In another example, the first and second conformal spacer layers 208, 212 may contain a different material selected from the group containing or consisting of nitrides, oxides, and oxynitrides of silicon. For example, the first spacer layer 108 may contain or consist of silicon nitride ($Si_xN_y$, e.g., $Si_3N_4$, SiN, etc.) and the second spacer layer 212 may contain or consist of silicon oxide ($SiO_z$, where z is greater than zero (e.g., $SiO_2$, SiO, etc.). In another example, the first spacer layer 208 may contain or consist of silicon oxide and the second spacer layer 212 may contain or consist of silicon nitride. Alternately or in addition to the above materials, in other examples, the first spacer layer 108, the second spacer layer 112, or both, may contain SiCN, SiBN, or SiBCN, or a combination thereof. A thickness of each of the deposited first and second spacer layers 208, 210 may range from about 1 nm to about 20 nm, from about 2 nm and about 10 nm, for example about 3 nm.

Figure 2F:
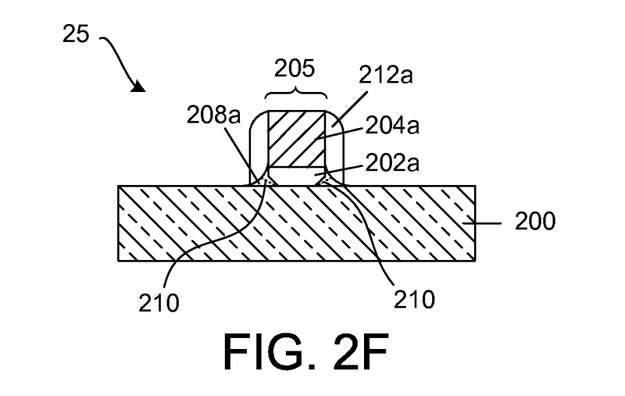

FIG. 2F depicts a structure 25 containing a second spacer 212a on the vertical sidewall of the gate stack 205. According to an embodiment of the invention, the second spacer layer 212 may be dry etched using an anisotropic plasma etching process, for example a reactive ion etching (RIE) process. The resulting second spacer 212a is a sidewall spacer and covers a sidewall of the gate stack 205 and the residual spacer 208a. Dry etching processes for plasma etching the second spacer layer 212 to form the second spacer 212a are well known to those in the art. In one example, similar plasma etching processes may be used for etching the first and second spacer layers 208, 212; where the first spacer layer 208 is plasma etched for a longer period of time than the second spacer layer 212.

Figure 2G:
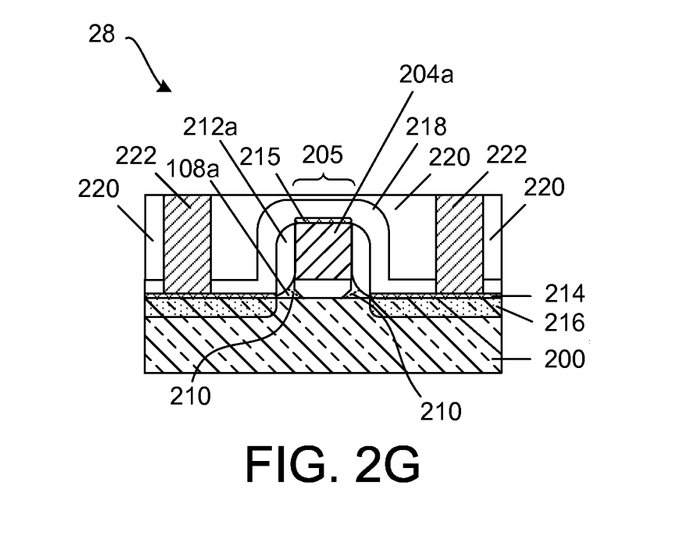

Referring now to FIG. 2G, the structure 28 is similar to the structure 18 of FIG. 1I. The structure 28 contains, source and drain extension regions 216, silicide regions 214,215, conformal dielectric passivation film 218, interlayer dielectric 220, and metal contacts 222.

A plurality of embodiments for forming dual sidewall spacers for seam protection of patterned structures has been disclosed. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned structure is directly on and in immediate contact with the substrate; there may be a second film or other structure between the film and the patterned structure.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

The invention claimed is:

1. A method for forming a dual sidewall spacer for seam protection of a patterned structure, comprising:
   providing a substrate containing a patterned structure on a surface of the substrate;
   depositing a conformal first spacer layer over the patterned structure, the conformal first spacer layer having a seam propagating through a thickness of the conformal first spacer layer near an interface region of the surface of the substrate and a sidewall of the patterned structure;
   etching the conformal first spacer layer to form a residual spacer at the interface region, wherein the residual spacer coats less than the entirety of the sidewall of the patterned structure;
   depositing a second spacer layer on the residual spacer and on the sidewall of the patterned structure not coated by the residual spacer, the second spacer layer being seam-free on the seam of the residual spacer; and
   etching the second spacer layer to form a second spacer coating the residual spacer and coating the sidewall of the patterned structure not coated by the residual spacer.

2. The method of claim 1, wherein the conformal first spacer layer and the second spacer layer comprise the same material.

3. The method of claim 1, wherein the conformal first spacer layer and the second spacer layer comprise a different material.

4. The method of claim 1, wherein the conformal first spacer layer and the second spacer layer comprise a nitride, an oxide, an oxynitride, or a combination thereof.

5. The method of claim 1, wherein the conformal first spacer layer and the second spacer layer comprise a nitride of silicon, an oxide of silicon, an oxynitride of silicon, or a combination thereof.

6. The method of claim 1, wherein the patterned structure contains an undercut near the interface region with the surface of the substrate, the surface of the substrate and the undercut in the patterned structure forming an angle of less than 90 degrees.

7. The method of claim 1, wherein the patterned structure comprises a gate dielectric on the substrate, a source region and a drain region in the surface of the substrate adjacent the gate dielectric, and a gate conductor on the gate dielectric.

8. The method of claim 7, wherein the patterned structure contains an undercut in the gate dielectric near the interface region with the surface of the substrate.

9. A method for forming a dual sidewall spacer for seam protection of gate stack, comprising:
   providing a substrate with a gate stack containing a gate dielectric on the substrate, a source region and a drain region in a surface of the substrate adjacent the gate dielectric, and a gate conductor on the gate dielectric;
   depositing a conformal first spacer layer over the gate stack, the conformal first spacer layer having a seam propagating through a thickness of the conformal first spacer layer near an interface region of the surface of the substrate and a sidewall of the gate stack;

etching the conformal first spacer layer to form a residual spacer at the interface region, wherein the residual spacer coats less than the entirety of the sidewall of the gate stack, depositing a second spacer layer on the residual spacer and on the sidewall of the gate stack not coated by the residual spacer, the second spacer layer being seam-free on the seam of the residual spacer; and etching the second spacer layer to form a second spacer coating the residual spacer and coating the sidewall of the gate stack not coated by the residual spacer.

10. The method of claim 9, wherein the conformal first spacer layer and the second spacer layer comprise the same material.

11. The method of claim 9, wherein the conformal first spacer layer and the second spacer layer comprise a different material.

12. The method of claim 9, wherein the conformal first spacer layer and the second spacer layer comprise a nitride, an oxide, an oxynitride, or a combination thereof.

13. The method of claim 9, wherein the gate stack contains an undercut near the interface region with the surface of the substrate, the surface of the substrate and the undercut in the gate stack forming an angle of less than 90 degrees.

* * * * *